US012652876B2

(12) United States Patent
Seo et al.

(10) Patent No.: US 12,652,876 B2
(45) Date of Patent: Jun. 9, 2026

(54) IMAGE SENSOR

(71) Applicant: Samsung Electronics Co., Ltd.,
Suwon-si (KR)

(72) Inventors: Jae-Kwan Seo, Suwon-si (KR); Si Ho Kim, Suwon-si (KR); Hyung Suk Oh, Suwon-si (KR); Young Gil Yoon, Suwon-si (KR); Woo Won Lee, Suwon-si (KR); Seul-Young Jeong, Suwon-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 427 days.

(21) Appl. No.: 18/488,078

(22) Filed: Oct. 17, 2023

(65) Prior Publication Data

US 2024/0243150 A1 Jul. 18, 2024

(30) Foreign Application Priority Data

Jan. 13, 2023 (KR) ........................ 10-2023-0005446

(51) Int. Cl.
*H10F 39/00* (2025.01)

(52) U.S. Cl.
CPC ..... *H10F 39/8063* (2025.01); *H10F 39/8053* (2025.01); *H10F 39/807* (2025.01); *H10F 39/811* (2025.01)

(58) Field of Classification Search
CPC ............. H10F 39/8063; H10F 39/8053; H10F 39/807; H10F 39/811; H10F 39/024; H10F 39/182; H10F 39/8023; H10F 39/199; H10F 39/802
See application file for complete search history.

(56) References Cited

U.S. PATENT DOCUMENTS

| | | | |
|---|---|---|---|
| 8,023,017 B2 | 9/2011 | Hsu | |
| 8,300,335 B2 | 10/2012 | Wu | |
| 8,916,980 B2 | 12/2014 | Dai et al. | |
| 11,217,632 B2 | 1/2022 | Li et al. | |
| 2020/0185451 A1 | 6/2020 | Skeete | |
| 2021/0385394 A1 | 12/2021 | Miyawaki et al. | |

FOREIGN PATENT DOCUMENTS

CN          116124782 A  *  5/2023 ............. H10K 71/70

* cited by examiner

*Primary Examiner* — Georgia Y Epps
*Assistant Examiner* — Monica T Taba
(74) *Attorney, Agent, or Firm* — Wolf, Greenfield & Sacks, P.C.

(57) ABSTRACT

An image sensor includes a substrate including a first region and a second region disposed in a periphery of the first region. The first region includes a plurality of unit pixels and a color filter structure, and the second region includes a dummy structure including a second color filter and a plurality of dummy lenses on the second color filter. The color filter structure includes a first extension portion extending in a first direction and a second extension portion extending in a second direction, and the dummy structure includes a third extension portion extending in the first direction and a fourth extension portion extending in the second direction. A first micro-lens, a second micro-lens, and a third micro-lens are in a first corner portion, and a first dummy lens, a second dummy lens, and a third dummy lens are in the second corner portion.

20 Claims, 16 Drawing Sheets

IMAGE SENSOR

CROSS-REFERENCE TO RELATED APPLICATION

This application claims priority from Korean Patent Application No. 10-2023-0005446 filed on Jan. 13, 2023 in the Korean Intellectual Property Office and all the benefits accruing therefrom under 35 U.S.C. 119, the contents of which in its entirety are herein incorporated by reference.

FIELD

The present disclosure relates to an image sensor.

BACKGROUND

An image sensor may include semiconductor elements that convert optical information into an electrical signal. The image sensor may be provided by a charge coupled device (CCD) image sensor and a complementary metal-oxide semiconductor (CMOS) image sensor.

The image sensor may be configured in the form of a package. In this case, the package may be configured in a structure that protects the image sensor and that allows light to enter a photo receiving surface or a sensing area of the image sensor at the same time.

Recently, a backside illumination (BSI) image sensor, in which incident light is irradiated through a back side of a semiconductor substrate so that pixels formed in the image sensor have improved light receiving efficiency and light sensitivity, has been studied.

BRIEF SUMMARY

An object of the present disclosure is to provide an image sensor that resolves a stain defect that may occur in a process of forming a color filter structure.

The objects of the present disclosure are not limited to those mentioned above and additional objects of the present disclosure, which are not mentioned herein, will be clearly understood by those skilled in the art from the following description of the present disclosure.

An image sensor according to one aspect of the present disclosure comprises a substrate including a first region and a second region disposed in a periphery of the first region, wherein the first region includes a plurality of unit pixels and a color filter structure, each unit pixel of the plurality of unit pixel includes a photoelectric conversion layer, the color filter structure includes a plurality of first color filters and a plurality of micro-lenses on the plurality of first color filters, wherein the second region includes a dummy structure including a second color filter and a plurality of dummy lenses on the second color filter, wherein a size of each of the plurality of dummy lenses is larger than a size of each of the plurality of micro-lenses, wherein, in a region adjacent to the dummy structure, the color filter structure includes a first extension portion extending in a first direction and a second extension portion extending in a second direction, wherein the first direction and the second direction intersect, and wherein the first extension portion and the second extension portion are connected by a first corner portion, wherein, in a region adjacent to the color filter structure, the dummy structure includes a third extension portion extending in the first direction and a fourth extension portion extending in the second direction, wherein the third extension portion and the fourth extension portion are connected by a second corner portion, wherein a first micro-lens, a second micro-lens, and a third micro-lens among the plurality of micro-lenses are in the first corner portion, and wherein a slope of each virtual line connecting outermost sidewalls of each of the first-micro lens, the second micro-lens, and the third micro-lens is different, and wherein a first dummy lens, a second dummy lens, and a third dummy lens from among the plurality of dummy lenses are in the second corner portion, wherein a slope of each virtual line connecting outermost sidewalls of each of the first dummy lens, the second dummy lens, and the third dummy lens is different.

In one embodiment, the slope of each virtual line connecting the outermost sidewalls of each of the first micro-lens, the second micro-lens, and the third micro-lens and a slope of each virtual line connecting the outermost sidewalls of each additional micro-lens from among the plurality of micro-lenses is increased or reduced as the virtual line approaches the first extension portion. In one embodiment, a slope formed by the virtual line connecting the outermost sidewalls of each of the plurality of micro-lenses in the first corner portion and the virtual line connecting the outermost sidewalls of each of the plurality of micro-lenses in the first extension portion is an acute angle. In one embodiment, the slope of each virtual line connecting the outermost sidewalls of the first dummy lens, the second dummy lens, and the third dummy lens and a slope of each virtual line connecting the outermost sidewalls of each additional dummy lens from among the plurality of dummy lenses is increased or reduced as the virtual line approaches the third extension portion. In one embodiment, a slope formed by the virtual line connecting the outermost sidewalls of each of the plurality of dummy lenses in the second corner portion and the virtual line connecting the outermost sidewalls of each of the plurality of dummy lenses in the third extension portion is an acute angle. In one embodiment, the substrate further includes a third region between the first and second regions, wherein the third region includes the second color filter. In one embodiment, the color filter structure further includes a grid pattern between the plurality of first color filters, and wherein the grid pattern is not between the third region and the first region. In one embodiment, a first passivation layer formed on the plurality of micro-lenses along a surface of each of the plurality of micro-lenses. In one embodiment, a second passivation layer is formed on the first passivation layer, wherein a thickness of the second passivation layer is less than a thickness of the first passivation layer. In one embodiment, the first passivation layer is not in a region between the plurality of micro-lenses to partially expose the plurality of micro-lenses, and wherein the second passivation layer is formed on the first passivation layer to cover exposed micro-lenses from among the plurality of micro-lenses. In one embodiment, the second passivation layer contacts the exposed micro-lenses.

An image sensor according to another aspect of the present disclosure comprises a substrate including a first region, a second region disposed in the periphery of the first region, and a third region between the first region and the second region, wherein the first region includes a plurality of unit pixels and a color filter structure, wherein the plurality of unit pixels include including a photoelectric conversion layer, and wherein the color filter structure includes a plurality of first color filters, a plurality of micro-lenses on the plurality of first color filters, and a grid pattern between the plurality of first color filters and the plurality of micro-lenses, wherein the second region includes a first dummy structure that includes a second color filter and a plurality of dummy lenses on the second color filter, wherein a size of each of the plurality of dummy lenses is larger than a size of each of the plurality of micro-lenses, wherein the third region includes a second dummy structure that includes the second color filter, wherein, in a region adjacent to the first dummy structure, the color filter structure includes a first extension portion extending in a first direction and a second extension portion extending in a second direction, wherein the first direction and second direction intersect, and wherein the first extension portion and the second extension portion are connected by a first corner portion, wherein, in a region adjacent to the color filter structure, the first dummy structure includes a third extension portion extending in the first direction and a fourth extension portion extending in the second direction, wherein the third extension portion and the fourth extension portion are connected by a second corner portion, and wherein the grid pattern is not disposed in the first corner portion.

An image sensor according to other aspect of the present disclosure comprises a substrate a substrate including first and second surfaces facing each other, the substrate including a first region, a second region in the periphery of the first region, and a third region between the first region and the second region, a plurality of unit pixels in the first region of the substrate, wherein the plurality of unit pixels include a photoelectric conversion layer; a wiring structure on the first surface of the substrate, wherein the wiring structure includes an inter-wiring insulating layer and a first wiring in the inter-wiring insulating layer; a color filter structure on the second surface of the substrate and in the first region of the substrate, wherein the color filter structure includes a plurality of first color filters and a plurality of micro-lenses on the plurality of first color filters; a first dummy structure on the second surface of the substrate and in the second region of the substrate, wherein the first dummy structure includes a second color filter and a plurality of dummy lenses on the second color filter; a second dummy structure in the third region of the substrate, wherein the second dummy structure includes the second color filter; a first passivation layer formed on the plurality of micro-lenses along a surface of each of the plurality of micro-lenses; and a second passivation layer formed on the first passivation layer, wherein, in a region adjacent to the first dummy structure, the color filter structure includes a first extension portion extending in a first direction and a second extension portion extending in a second direction, wherein the first direction and second direction intersect, and wherein the first extension portion and the second extension portion are connected by a first corner portion, wherein, in a region adjacent to the color filter structure, the first dummy structure includes a third extension portion extending in the first direction and a fourth extension portion extending in the second direction, wherein the third extension portion and the fourth extension portion are connected by a second corner portion, a slope of a virtual line connecting outermost sidewalls of the color filter structure is increased or reduced in the first corner portion, and a slope of a virtual line connecting outermost sidewalls of the first dummy structure is increased or reduced in the second corner portion.

Details of the other embodiments are included in the detailed description and drawings.

BRIEF DESCRIPTION OF THE DRAWINGS

The above and other aspects and features of the present disclosure will become more apparent by describing in detail exemplary embodiments thereof with reference to the attached drawings, in which:

FIG. 1 is an exemplary block view illustrating an image sensor according to some embodiments of the present disclosure;

FIG. 12 is an exemplary view of an image sensor according to some embodiments of the present disclosure;

FIG. 13 is an exemplary view of an image sensor according to some embodiments of the present disclosure;

DETAILED DESCRIPTION OF THE DISCLOSURE

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements.

As used herein, the phrase "at least one of A, B, and C" refers to a logical (A OR B OR C) using a non-exclusive logical OR, and should not be construed to mean "at least one of A, at least one of B and at least one of C."

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items."

Hereinafter, an image sensor according to some embodiments will be described with reference to FIGS. 1 to 16.

Figure 1:
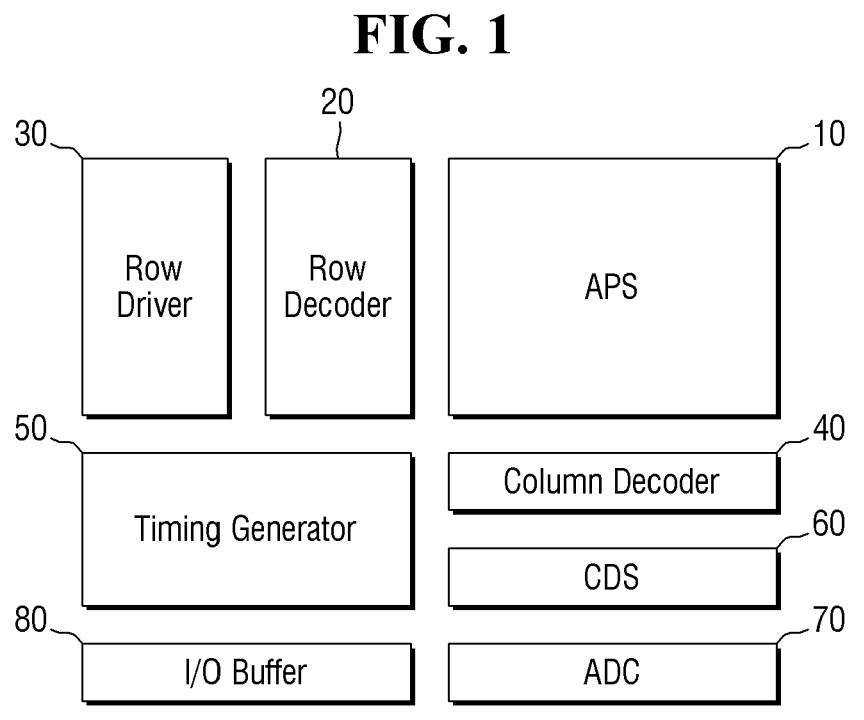
Figure 2:
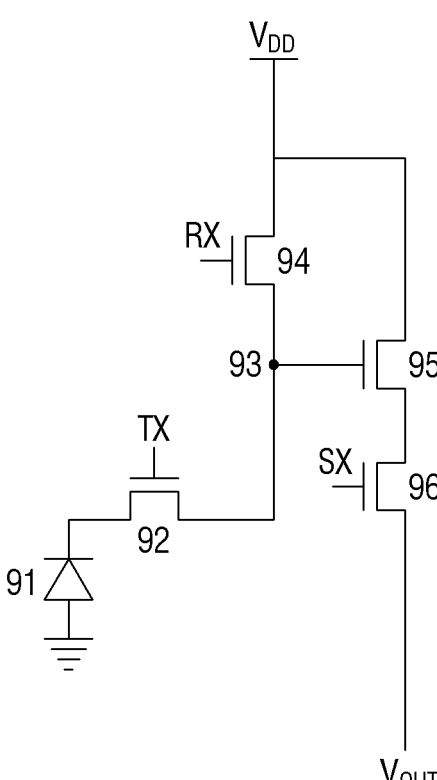
FIG. 2 is an exemplary circuit view illustrating a unit pixel of an image sensor according to some embodiments of the present disclosure.

FIG. 1 is an exemplary block diagram illustrating an image sensor according to some embodiments of the present disclosure. FIG. 2 is an exemplary circuit view illustrating a unit pixel of an image sensor according to some embodiments of the present disclosure.

Referring to FIG. 1, the image sensor according to some embodiments includes an active pixel sensor array (APS) 10, a row decoder 20, a row driver 30, a column decoder 40, a timing generator 50, a correlated double sampler (CDS) 60, an analog-to-digital converter (ADC) 70, and an input/output (I/O) buffer 80.

The active pixel sensor array 10 includes a plurality of unit pixels that have a two-dimensional arrangement and may convert an optical signal into an electrical signal. The active pixel sensor array 10 may be driven by a plurality of drive signals, such as a pixel selection signal, a reset signal and a charge transmission signal received from the row driver 30. In addition, the electrical signal converted by the active pixel sensor array 10 may be provided to the correlated double sampler 60.

The row driver 30 may provide a plurality of driving signals for driving the plurality of unit pixels to the active pixel sensor array 10 in accordance with a result decoded by the row decoder 20. When the unit pixels are arranged in the form of a matrix, driving signals may be provided for each row.

The timing generator 50 may provide a timing signal and a control signal to the row decoder 20 and the column decoder 40.

The correlated double sampler 60 may hold and sample the electrical signal by receiving the electrical signal generated by the active pixel sensor array 10. The correlated double sampler 60 samples both a specific noise level and a signal level by the electrical signal to output a difference level corresponding to a difference between the noise level and the signal level.

The analog-to-digital converter 70 may convert an analog signal corresponding to the difference level output from the correlated double sampler 60 into a digital signal and output the digital signal.

The input/output buffer 80 latches the digital signal and may sequentially output the latched signal to an image signal processor (not shown) as the digital signal in accordance with the decoding result of the column decoder 40.

Referring to FIG. 2, each unit pixel may include a photoelectric conversion layer 91, a transmission transistor 92, a floating diffusion region 93, a reset transistor 94, a source follower transistor 95 and a selection transistor 96.

The photoelectric conversion layer 91 may generate charges that are proportional to the amount of incident light from the outside. The photoelectric conversion layer 91 may be coupled with the transmission transistor 92 that transmits charges, which are generated and then accumulated, to the floating diffusion region 93. Since the floating diffusion region 93 is a region for converting charges into voltages, the charges may be cumulatively stored in the floating diffusion region 93 because the floating diffusion region has a parasitic capacitance.

One end of the transmission transistor 92 may be connected to the photoelectric conversion layer 91, and the other end of the transmission transistor 92 may be connected to the floating diffusion region 93. The transmission transistor 92 may be formed of a transistor driven by a predetermined bias (e.g., transmission signal TX). That is, the transmission transistor 92 may transmit the charges generated from the photoelectric conversion layer 91 to the floating diffusion region 93 in accordance with the transmission signal TX.

The source follower transistor 95 may amplify a change in an electric potential of the floating diffusion region 93 that has received the charges from the photoelectric conversion layer 91 and may output the amplified change in the electric potential to an output line $V_{OUT}$. When the source follower transistor 95 is turned on, a predetermined electrical potential provided to a drain of the source follower transistor 95, for example, a power voltage $V_{DD}$ may be transferred to a drain region of the selection transistor 96.

The selection transistor 96 may select a unit pixel to be read in a row unit. The selection transistor may be a transistor that is driven by a selection line that applies a predetermined bias (e.g., row selection signal SX).

The reset transistor 94 may periodically reset the floating diffusion region 93. The reset transistor 94 may be a transistor driven by a reset line that applies a predetermined bias (e.g., reset signal RX). When the reset transistor 94 is turned on by the reset signal RX, a predetermined electrical potential provided to the drain of the reset transistor 94, for example, a power voltage $V_{DD}$ may be transferred to the floating diffusion region 93.

Figure 3:
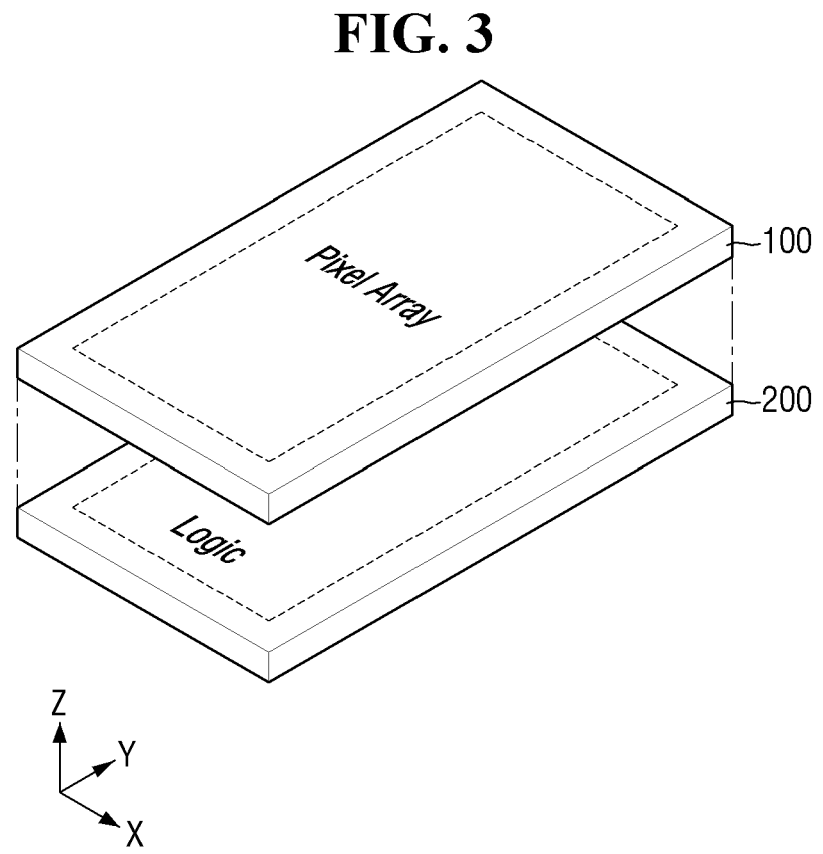
FIG. 3 is a view illustrating a conceptual layout of an image sensor according to some embodiments of the present disclosure.

FIG. 3 is a view illustrating a conceptual layout of an image sensor according to some embodiments.

Referring to FIG. 3, the image sensor according to some embodiments may include a first substrate structure 100 and a second substrate structure 200, which are stacked.

In the first substrate structure 100, a plurality of unit pixels may be arranged in a two-dimensional array structure on a plane including a first direction X and a second direction Y. That is, the first substrate structure 100 may include a pixel array. The first direction X and the second direction Y may be perpendicular to each other.

The second substrate structure 200 may include a logic region or the like. The second substrate structure 200 may be below the first substrate structure 100. The first substrate structure 100 and the second substrate structure 200 may be electrically connected to each other. The second substrate structure 200 may allow a pixel signal transferred from the first substrate structure 100 to be transferred to the logic region of the second substrate structure 200.

Logic elements may be in the logic region of the second substrate structure 200. The logic elements may include circuits for processing pixel signals received from the unit pixels.

The first substrate structure 100 and the second substrate structure 200 may be stacked in a third direction Z. The third direction Z may be a direction perpendicular to the first direction X and the second direction Y.

Figure 4:
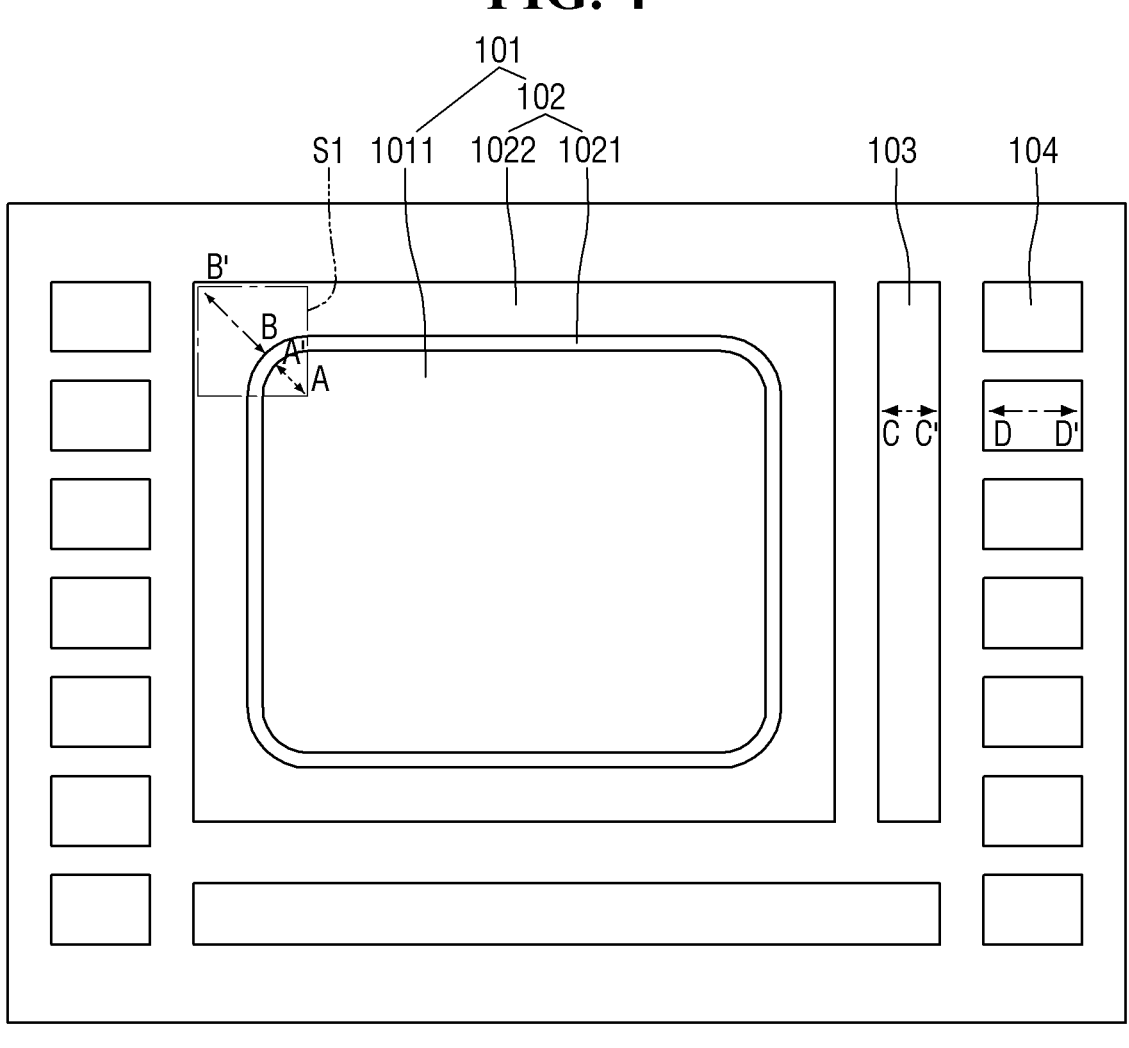
FIG. 4 is an exemplary layout view illustrating an image sensor according to some embodiments of the present disclosure.
Figure 4:
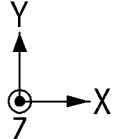

FIG. 4 is an exemplary layout view illustrating an image sensor according to some embodiments.

Referring to FIG. 4, the image sensor according to some embodiments includes a sensor array region 101, a light shielding region 102, a connection region 103 and a pad region 104.

The sensor array region 101 may include a region corresponding to the active pixel sensor array 10 of FIG. 1. For example, a plurality of unit pixels arranged in two dimensions (for example, in the form of a matrix) on a plane extended in a first direction X and a second direction Y may be formed in the sensor array region 101.

The sensor array region 101 may include a light receiving region 1011 and the light shielding region 102. Active pixels for receiving light to generate an active signal may be arranged in the light receiving region 1011. Optical black pixels for shielding light to generate an optical black signal may be arranged in the light shielding region 102. The light shielding region 102 may be formed along the periphery of the light receiving region 1011, but this arrangement is only exemplary, and it should be understood that other arrangements may be provided in other embodiments.

In view of a plane, the light shielding region 102 may include a first dummy region 1021 in the periphery of the light receiving region 1011 and a second dummy region 1022 in the periphery of the first dummy region 1021. In some embodiments, the sensor array region 101 may be a first region in which a color filter structure 1023, which will be described later, is positioned, and the second dummy region 1022 may be a second region in which a first dummy structure 1024 is positioned. The first dummy region 1021 between the sensor array region 101 and the second dummy region 1022 may be a third region in which a second dummy structure 1025 is position.

In some embodiments, dummy pixels (not shown) may be formed in the light receiving region 1011 adjacent to the light shielding region 102.

The connection region 103 may be formed in the periphery of the sensor array region 101. The connection region 103 may be formed at one side of the sensor array region 101, but this is only exemplary, and it should be understood that the connection region 103 may be formed at other locations in other embodiments. Lines may be formed in the connection region 103 to transmit and receive the electrical signal of the sensor array region 101.

The pad region 104 may be formed in the periphery of the sensor array region 101. The pad region 104 may be formed to be adjacent to an edge of the image sensor according to some embodiments, but this is only exemplary, and it should be understood that the pad region 104 may be formed at other locations in other embodiments. The pad region 104 may be connected to an external device or the like to transmit and receive an electrical signal between the image sensor according to some embodiments and the external device.

In some embodiments, the connection region 103 and the pad region 104 may be in the periphery of the sensor array region 101, but it should be understood that the connection region 103 and the pad region 104 may have other arrangements in other embodiments.

Figure 5:
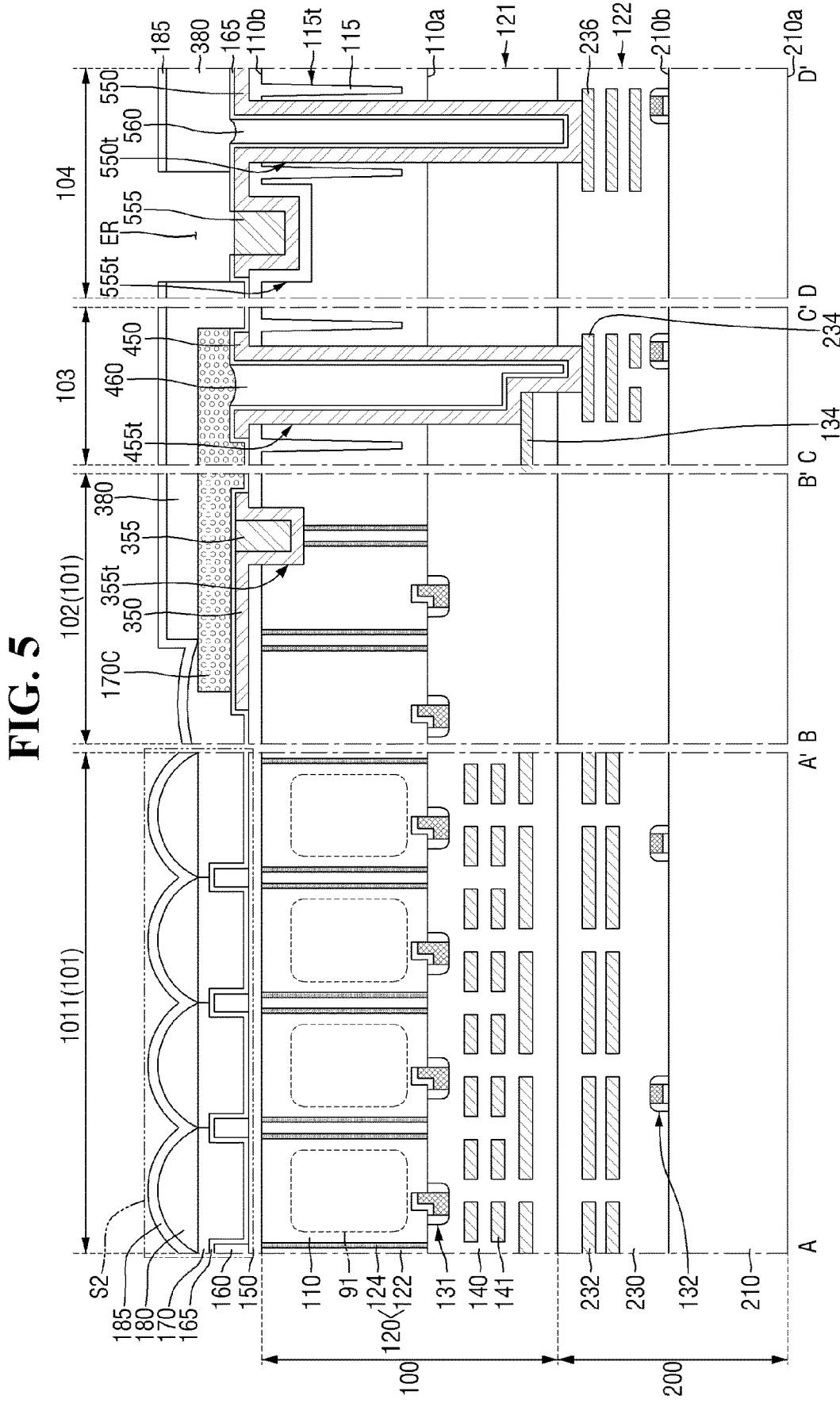
FIG. 5 is a cross-sectional view taken along lines A-A', B-B', C-C' and D-D' of FIG. 4 according to some embodiments of the present disclosure.

FIG. 5 is a cross-sectional view taken along lines A-A', B-B', C-C' and D-D' of FIG. 4.

Referring to FIG. 5, an image sensor according to some embodiments may include a first substrate 110, a pixel isolation pattern 120, a first wiring structure 121, a second wiring structure 122, a second substrate 210, a surface insulating layer 150, a grid pattern 160, a first passivation layer 165, a first color filter 170, a micro-lens 180, a second passivation layer 185, a second color filter 170C and a dummy lens 380.

The first substrate 110 may be a semiconductor substrate. For example, the first substrate 110 may be a bulk silicon or a silicon-on-insulator (SOI). The first substrate 110 may be a silicon substrate, or may include other materials such as silicon germanium, indium antimonide, lead telluride, indium arsenide, indium phosphide, gallium arsenide or gallium antimonide. Alternatively, the first substrate 110 may be an epitaxial layer formed on a base substrate.

The first substrate 110 may include a first surface 110a and a second surface 110b, which are opposite to each other. In the embodiments described below, the first surface 110a may be referred to as a front side of the first substrate 110, and the second surface 110b may be referred to as a back side of the first substrate 110. In some embodiments, the second surface 110b of the first substrate 110 may be a light receiving surface on which light is incident. That is, the image sensor according to some embodiments may be a backside illumination (BSI) image sensor.

A plurality of unit pixels may be formed in the first substrate 110 of the sensor array region 101. Although not shown, a plurality of pixels arranged in two dimensions (e.g., in the form of a matrix) on a plane including a first direction X and a second direction Y may be formed in the light receiving region 1011.

Each unit pixel of may include a photoelectric conversion layer 91. The photoelectric conversion layer 91 may be formed in the first substrate 110 of the light receiving region 1011 and the light shielding region 102. The photoelectric conversion layer 91 may generate charges that are proportional to the amount of incident light from the outside. In some embodiments, a dummy photoelectric conversion layer may be formed in a portion of the light shielding region 102. That is, the photoelectric conversion layer 91 formed in the light shielding region 102 may be an active photoelectric conversion layer or a dummy photoelectric conversion layer, but.

The photoelectric conversion layer 91 may include, but is not limited to, at least one of a photo diode, a photo transistor, a photo gate, a pinned photo diode, an organic photo diode, and a quantum dot.

Each unit pixel may include a first electronic element 131. In some embodiments, the first electronic element 131 may be formed on the first surface 110a of the first substrate 110. The first electronic element 131 may be connected to the photoelectric conversion layer 91 to thereby process an electrical signal. For example, the first electronic element 131 may include various transistors, such as the transmission transistor 92, the reset transistor 94, the source follower transistor 95 or the selection transistor 96 described above with reference to FIG. 2.

As another example, the first electronic element 131 may include a vertical transmission transistor. A portion of the first electronic element 131 comprising the transmission transistor 92 may be extended into the first substrate 110. The transmission transistor 92 may reduce an area of a unit pixel to enable high integration of the image sensor.

The pixel isolation pattern 120 may be formed in the first substrate 110. The pixel isolation pattern 120 may define a plurality of unit pixels in the first substrate 110. For example, the pixel isolation pattern 120 may be formed in a lattice shape to surround each unit pixel arranged in the form of a matrix.

In some embodiments, the pixel isolation pattern 120 may pass through the first substrate 110. For example, the pixel isolation pattern 120 may continuously extend from the first surface 110a of the first substrate 110 to the second surface 110b of the first substrate 110.

In some embodiments, the pixel isolation pattern 120 may include a conductive filling pattern 122 and an insulating spacer film 124. For example, an isolation trench defining a plurality of unit pixels may be formed in the first substrate 110. The insulating spacer film 124 may extend along a side of the isolation trench. The conductive filling pattern 122 may be formed on the insulating spacer film 124 to fill the remaining region of the separation trench. The insulating spacer film 124 may electrically insulate the conductive filling pattern 122 from the first substrate 110.

The conductive filling pattern 122 may include, for example, polysilicon (poly Si) but is not limited thereto. In some embodiments, a ground voltage or a negative voltage may be applied to the conductive filling pattern 122. In this case, an electrostatic discharge (ESD) bruise defect of the image sensor may be effectively inhibited. In this case, the ESD bruise defect means that a stain, such as a bruise, is generated as charges generated by ESD, etc., and the charges are accumulated on the first substrate 110.

The insulating spacer film 124 may include at least one of, for example, silicon oxide, aluminum oxide, and tantalum oxide, but is not limited thereto. In some embodiments, the insulating spacer film 124 may include a low refractive index material having a refractive index lower than the refractive index of the first substrate 110. In this case, the insulating spacer film 124 may refract or reflect incident light obliquely on the photoelectric conversion layer 91, thereby improving light condensing efficiency to improve the quality of the image sensor. In addition, the insulating spacer film 124 may prevent photocharges generated in a specific unit pixel by incident light from moving to adjacent unit pixels due to random drift.

The first wiring structure 121 may be formed on the first substrate 110. For example, the first wiring structure 121 may cover the first surface 110a of the first substrate 110. The second wiring structure 122 may be formed on the first wiring structure 121. The first wiring structure 121 may be between the first substrate 110 and the second wiring structure 122. That is, an upper surface of the first wiring structure 121 may be in contact with the first surface 110a of the first substrate 110. A lower surface of the first wiring structure 121 may be in contact with an upper surface of the second wiring structure 122. The first substrate 110, the first wiring structure 121 and the second wiring structure 122 may collectively form the first substrate structure 100.

The first wiring structure 121 may include one or more wirings. For example, the first wiring structure 121 may include a first inter-wiring insulating layer 140, a plurality of first wirings 141 in the first inter-wiring insulating layer, and a plurality of contacts. In FIG. 5, the number of layers and arrangement of wirings constituting the first wiring structure 121 is only exemplary. The first inter-wiring insulating layer

140 may include, but is not limited to, at least one of silicon oxide, silicon nitride, silicon oxynitride or a low-k material having a dielectric constant lower than a dielectric constant of silicon oxide.

In some embodiments, the first wiring structure 121 may include a plurality of first wirings 141 in the sensor array region 101 and a second wiring 134 in the connection region 103. The plurality of first wirings 141 may be electrically connected to a unit pixel of the sensor array region 101. For example, the plurality of first wirings 141 may be connected to the first electronic element 131. The second wiring 134 may be extended from the sensor array region 101. For example, the second wiring 134 may be electrically connected to at least a portion of the plurality of first wirings 141. Therefore, the second wiring 134 may be electrically connected to the unit pixel of the sensor array region 101.

Although not shown in detail, the first wiring structure 121 may include a plurality of contacts in the sensor array region 101, the connection region 103 and the pad region 104. The plurality of contacts in the sensor array region 101 may be connected to the first electronic element 131 or the source/drain region.

The plurality of first wirings 141 and the plurality of contacts may include, but is not limited to, at least one of tungsten (W), copper (Cu), aluminum (Al), gold (Au), silver (Ag) or an alloy thereof.

The second substrate 210 may be a bulk silicon or a silicon-on-insulator (SOI). The second substrate 210 may be a silicon substrate, or may include other materials such as silicon germanium, indium antimonide, lead telluride, indium arsenide, indium phosphide, gallium arsenide or gallium antimonide. Alternatively, the second substrate 210 may be an epitaxial layer formed on a base substrate.

The second substrate 210 may include a third surface 210a and a fourth surface 210b, which are opposite to each other. In some embodiments, the fourth surface 210b of the second substrate 210 may be a surface facing the first surface 110a of the first substrate 110.

A plurality of electronic elements may be formed on the second substrate 210. For example, a second electronic element 132 may be formed on the fourth surface 210b of the second substrate 210. The second electronic element 132 may be electrically connected to the sensor array region 101 to transmit and receive an electrical signal to and from each unit pixel of the sensor array region 101. For example, the second electronic element 132 may include the row decoder 20, the row driver 30, the column decoder 40, the timing generator 50, the correlated double sampler 60, the analog-to-digital converter 70 or the input/output buffer 80 of FIG. 1.

The second wiring structure 122 may be formed on the fourth surface 210b of the second substrate 210. The second wiring structure 122 may be attached to the first wiring structure 121. For example, and as shown in FIG. 5, the upper surface of the second wiring structure 122 may be attached to the lower surface of the first wiring structure 121.

The second wiring structure 122 may include one or more wirings. For example, the second wiring structure 122 may include a second inter-wiring insulating layer 230, and a plurality of wirings 232, 234 and 236 in the second inter-wiring insulating layer 230. In FIG. 5, the number of layers and arrangement of wirings of the second wiring structure 122 is only exemplary, and it should be understood that any number of layers and/or arrangement of wirings may be provided in other embodiments.

At least a portion of the wirings 232, 234 and 236 of the second wiring structure 122 may be connected to the second electronic element 132. In some embodiments, the second wiring structure 132 may include a third wiring 232 in the sensor array region 101, a fourth wiring 234 in the connection region 103, and a fifth wiring 236 in the pad region 104. In some embodiments, the fourth wiring 234 may be the uppermost wiring among the plurality of wirings in the connection region 103, and the fifth wiring 236 may be the uppermost wiring among the plurality of wirings in the pad region 104.

A first connection structure 350 may be formed in the light shielding region 102. The first connection structure 350 may be formed on the surface insulating layer 150 of the light shielding region 102. The first connection structure 350 may not be in contact with the pixel isolation pattern 120.

In some embodiments, a first trench 355t exposing the pixel isolation pattern 120 may be formed in the first substrate 110 and the surface insulating layer 150 of the light shielding region 102. The first connection structure 350 may be formed in the first trench 355t, and thus may be in contact with the pixel isolation pattern 120 in the light shielding region 102. In some embodiments, the first connection structure 350 may extend along a profile of sides and a lower surface of the first trench 355t.

The first connection structure 350 may overlap the pixel isolation pattern 120 in the light shielding region 102 in the third direction Z. The first connection structure 350 may shield incident light on the light shielding region 102 or the connection region 103.

A second connection structure 450 may be formed in the connection region 103. The second connection structure 450 may be formed on the surface insulating layer 150 of the connection region 103. The second connection structure 450 may electrically connect the first substrate 110 to the second substrate 210. For example, a second trench 455t exposing the second wiring 134 and the fourth wiring 234 may be formed in the first substrate 110, the first wiring structure 121 and the second wiring structure 122 of the connection region 103. The second connection structure 450 may be formed in the second trench 455t to connect the second wiring 134 to the fourth wiring 234. In some embodiments, the second connection structure 450 may extend along a profile of sides and a lower surface of the second trench 455t.

A third connection structure 550 may be formed in the pad region 104. The third connection structure 550 may be formed on the surface insulating layer 150 of the pad region 104. The third connection structure 550 may electrically connect the second substrate 210 to an external device.

For example, a third trench 550t exposing the fifth wiring 236 may be formed in the first substrate 110, the first wiring structure 121 and the second wiring structure 122 of the pad region 104. The third connection structure 550 may be formed in the third trench 550t, and thus may be in contact with the fifth wiring 236. In addition, a fourth trench 555t may be formed in the first substrate 110 of the pad region PR. The third connection structure 550 may be formed in the fourth trench 555t and then exposed. In some embodiments, the third connection structure 550 may extend along a profile of sides and a lower surface of the third trench 550t and the fourth trench 555t.

Each of the first connection structure 350, the second connection structure 450 and the third connection structure 550 may include, but is not limited to, at least one of titanium (Ti), titanium nitride (TiN), tantalum (Ta), tantalum nitride (TaN), tungsten (W), aluminum (Al), copper (Cu) or. In some embodiments, the first connection structure 350, the second connection structure 450 and the third connection structure 550 may be formed at the same level. In the present disclosure, the term "same level" refers to "being formed by the same manufacturing process."

In some embodiments, a first pad 355 filling the first trench 355t may be formed on the first connection structure 350. In some embodiments, a second pad 555 filling the fourth trench 555t may be formed on the third connection structure 550. The first pad 355 and the second pad 555 may include, but is not limited to, at least one of tungsten (W), copper (Cu), aluminum (Al), gold (Au), silver (Ag) or an alloy thereof. In some embodiments, the first pad 355 and the second pad 555 may be formed at the same level.

In some embodiments, a first filling insulating layer 460 filling the second trench 455t may be formed on the second connection structure 450. In some embodiments, a second filling insulating layer 560 filling the third trench 550t may be formed on the third connection structure 550. Each of the first filling insulating layer 460 and the second filling insulating layer 560 may include, but is not limited to, at least one of silicon oxide, aluminum oxide, and tantalum oxide. In some embodiments, the first filling insulating layer 460 and the second filling insulating layer 560 may be formed at the same level.

In some embodiments, the first passivation layer 165 may cover the first connection structure 350, the first pad 355, the second connection structure 450 and the third connection structure 550. For example, the first passivation layer 165 may extend such that is conformal along the profile of the first connection structure 350, the first pad 355, the second connection structure 450 and the third connection structure 550. In some embodiments, the first passivation layer 165 may expose the second pad 555.

An element isolation pattern 115 may be formed in the first substrate 110. For example, an element isolation trench 115t may be formed in the first substrate 110. The element isolation pattern 115 may be formed in the element isolation trench 115t. In some embodiments, the element isolation pattern 115 may be extended from the first surface 110a of the first substrate 110. In some embodiments, the element isolation pattern 115 may be spaced apart from the second surface 110b of the first substrate 110.

In FIG. 5, the element isolation pattern 115 is shown as being formed only in the periphery of the second connection structure 450 of the connection region 103 and the periphery of the third connection structure 550 of the pad region PR, but this is only exemplary. For example, the element isolation pattern 115 may be also formed in the periphery of the first connection structure 350 of the light shielding region 102.

The element isolation pattern 115 may include, but is not limited to, at least one of silicon oxide, silicon nitride, silicon oxynitride, aluminum oxide, hafnium oxide. In some embodiments, the element isolation pattern 115 may be formed at the same level as the surface insulating layer 150.

The surface insulating layer 150 may be formed on the second surface 110b of the first substrate 110. The surface insulating layer 150 may extend along the second surface 110b of the first substrate 110. In some embodiments, at least a portion of the surface insulating layer 150 may be in contact with the pixel isolation pattern 120.

The surface insulating layer 150 may include an insulating material. For example, the surface insulating layer 150 may include, but is not limited to, at least one of silicon oxide, silicon nitride, silicon oxynitride, aluminum oxide, and hafnium oxide.

The surface insulating layer 150 may operate as an anti-reflective layer to prevent reflection of light incident on the first substrate 110, thereby improving a light receiving rate of the photoelectric conversion layer 91. In addition, the surface insulating layer 150 may serve as a planarization layer to form the first color filter 170 and the micro-lens 180, which will be described later, at a uniform height.

The first color filter 170 may be on the surface insulating layer 150 of the light receiving region 1011. In some embodiments, the first color filter 170 may be arranged to correspond to each unit pixel. For example, a plurality of first color filters 170 may be arranged on a plane including the first direction X and the second direction Y in two dimensions (e.g., in the form of a matrix).

The first color filter 170 may have various color filters depending on a unit pixel. For example, the first color filter 170 may be arranged in a Bayer pattern that includes a red color filter, a green color filter, and a blue color filter, but this is only exemplary. The first color filter 170 may include a yellow filter, a magenta filter, a cyan filter, and a white filter.

The grid pattern 160 may be formed on the surface insulating layer 150. The grid pattern 160 may be formed in a lattice shape and interposed between the plurality of first color filters 170.

The grid pattern 160 may include a low refractive index material having a refractive index lower than that of silicon (Si). For example, the grid pattern 160 may include, but is not limited to, at least one of silicon oxide, aluminum oxide, and tantalum oxide. The grid pattern 160, which includes a low refractive index, may refract or reflect incident light obliquely on the image sensor, thereby improving quality of the image sensor.

In some embodiments, the first passivation layer 165 may be formed on the surface insulating layer 150 and the grid pattern 160. The first passivation layer 165 may be interposed between the surface insulating layer 150 and the first color filter 170 and between the grid pattern 160 and the first color filter 170. For example, the first passivation layer 165 may extend along a profile of an upper surface of the surface insulating layer 150 and sides and an upper surface of the grid pattern 160.

The first passivation layer 165 may include, for example, aluminum oxide, but is not limited thereto. The first passivation layer 165 may prevent the surface insulating layer 150 and the grid pattern 160 from being damaged.

The micro-lens 180 may be formed on the first color filter 170. The micro-lens 180 may be arranged to correspond to each unit pixel. For example, the micro-lens 180 may be arranged in two dimensions (e.g., in the form of a matrix) on a plane including the first direction X and the second direction Y.

The micro-lens 180 has a convex shape and may have a predetermined radius of curvature. Therefore, the micro-lens 180 may condense light incident on the photoelectric conversion layer 91. The micro-lens 180 may include, for example, a light-transmissive resin, but is not limited thereto.

In some embodiments, the second passivation layer 185 may be formed on the micro-lens 180. The second passivation layer 185 may extend along a surface of the micro-lens 180. The second passivation layer 185 may include, for example, an inorganic oxide layer. The second passivation layer 185 may include, but is not limited to, at least one of silicon oxide, titanium oxide, zirconium oxide, and hafnium oxide. In some embodiments, the second passivation layer 185 may include a low temperature oxide (LTO).

The second passivation layer 185 may protect the micro-lens 180 from the outside. For example, the second passivation layer 185 may include an inorganic oxide layer to protect the micro-lens 180 that includes an organic material. In addition, the second passivation layer 185 may improve light condensing capability of the micro-lens 180. For example, the second passivation layer 185 fills a space between the micro-lenses 180 to reduce reflection, refraction, scattering, etc., of incident light that reaches the space between the micro-lenses 180.

In some embodiments, the second color filter 170C may be on the second surface 110b of the first substrate 110 of the light shielding region 102 and the connection region 103. The second color filter 170C may cover the first connection structure 350. The second color filter 170C may be formed to cover a portion of the first passivation layer 165 in the light shielding region 102 and the connection region 103. The second color filter 170C may include, for example, a blue color filter, but is not limited thereto.

In some embodiments, the dummy lens 380 may be formed on the second color filter 170C. For example, the dummy lens 380 may be formed to cover a portion of the first passivation layer 165 in the light shielding region 102 and the connection region 103. In some embodiments, the second passivation layer 185 may extend along a surface of the dummy lens 380. A size of the dummy lens 380 may be greater than the size of the micro-lens 180. For example, a radius of curvature of the dummy lens 380 may be greater than the radius of the micro-lens 180.

The dummy lens 380 may include, for example, a light-transmissive resin, but is not limited thereto. In some embodiments, the dummy lens 380 may include the same material as the micro-lens 180.

In some embodiments, the second passivation layer 185 and the dummy lens 380 may expose the second pad 555. For example, an exposure opening 570 exposing the second pad 555 may be formed in the second passivation layer 185 and the dummy lens 380. Therefore, the second pad 555 may be connected to an external device or the like to transmit and receive an electrical signal between the image sensor and the external device. That is, the second pad 555 may be an input/output pad of the image sensor according to some embodiments.

Figure 6:
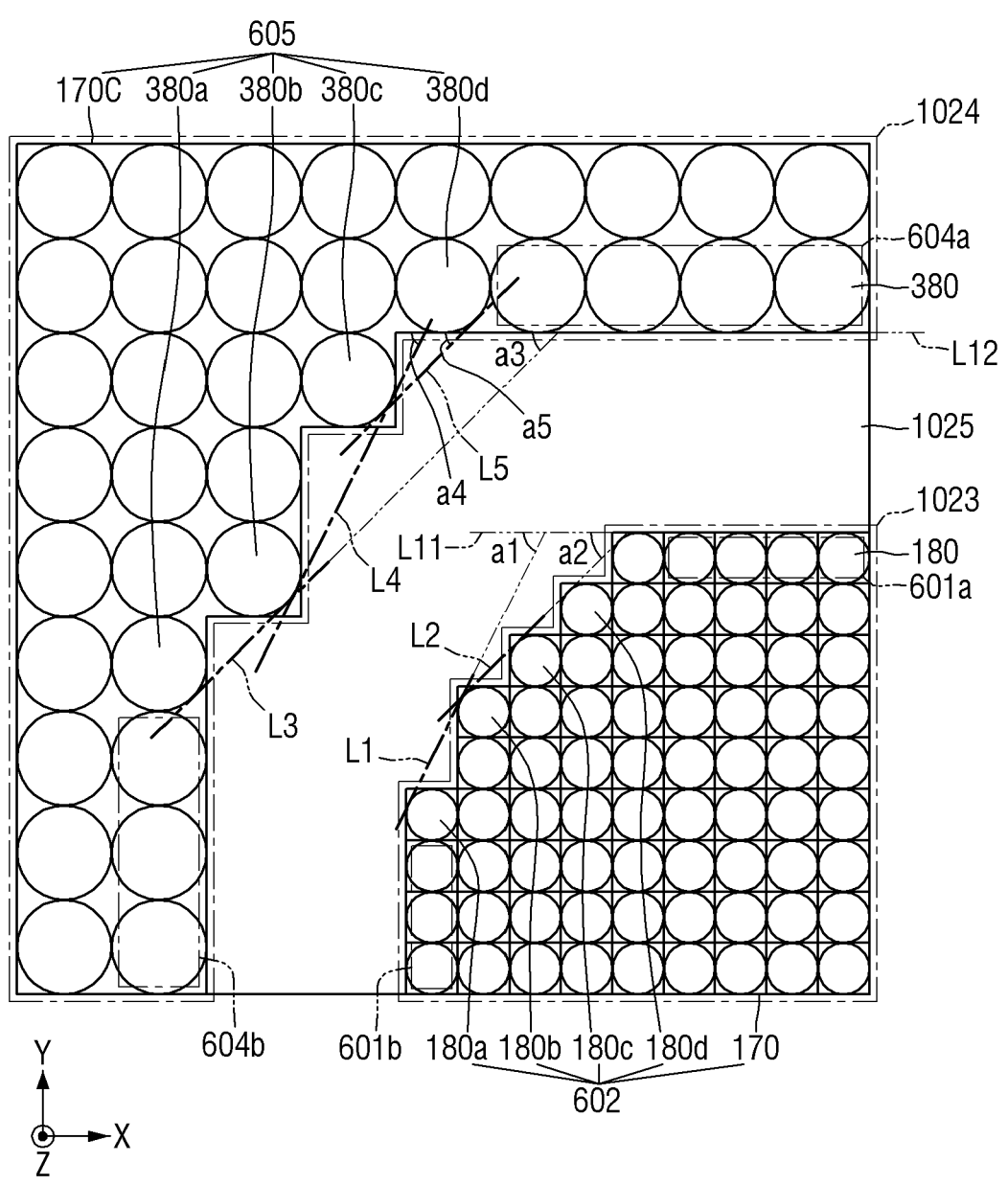
FIG. 6 is an enlarged view illustrating a region of FIG. 4 according to some embodiments of the present disclosure.

FIG. 6 is an enlarged view illustrating a region 106 of FIG. 4.

Referring to FIG. 6, the color filter structure 1023 may be in the sensor array region 101 of the first substrate 110. The color filter structure 1023 may include the plurality of first color filters 170 and the plurality of micro-lenses 180 on the plurality of first color filters 170.

The color filter structure 1023 may have a first extension portion 601a, a second extension portion 601b and a first corner portion 602 in a region most adjacent to the first dummy structure 1024. The first extension portion and the second extension portion may be respectively extended in the first direction X and the second direction Y. The first corner portion 602 may connect the first extension portion 601a to the second extension portion 601b and may be in a direction different from the first direction X and the second direction Y.

First to fourth micro-lenses 180a, 180b, 180c and 180d of the plurality of micro-lenses 180 may be in the first corner portion 602. Slopes of virtual lines connecting the outermost sidewalls of each of the first to third micro-lenses 180a, 180b and 180c may be different from each other.

That is, in the first corner portion 602, slopes of virtual lines connecting the outermost sidewalls of each of the plurality of first color filters 170 in which the plurality of micro-lenses 180 are may be different from each other. In other words, in the first corner portion 602, slopes of virtual lines connecting the outermost sidewalls of the color filter structure 1023 are different from each other and may be increased or reduced as described below.

In detail, a slope between a first virtual line L1 connecting the outermost sidewall of the first micro-lens 180*a* to the outermost sidewall of the second micro-lens 180*b* and a virtual line L11 connecting the outermost sidewalls of the plurality of micro-lenses 180 in the first direction X may be a first acute angle a1.

A slope between a second virtual line L2 connecting the outermost sidewall of the second micro-lens 180*b* to the outermost sidewall of the third micro-lens 180*c* and the virtual line L11 connecting the outermost sidewalls of the plurality of micro-lenses 180 in the first direction X may be a second acute angle a2.

In this case, the first acute angle a1 and the second acute angle a2 may be different from each other. The second acute angle a2 may be smaller than the first acute angle a1. That is, a slope of a virtual line connecting the outermost sidewalls of each of at least some of the plurality of micro-lenses 180 may be reduced as the virtual line approaches the first extension portion 601*a*.

The first dummy structure 1024 may be in the second dummy region 1022 of the first substrate 110. The first dummy structure 1024 may include a second color filter 170C and a plurality of dummy lenses 380 respectively on the second color filter 170C.

The first dummy structure 1024 may have a third extension portion 604*a*, a fourth extension portion 604*b* and a second corner portion 605 in a region most adjacent to the color filter structure 1023. The third extension portion 604*a* and the fourth extension portion 604*b* may be respectively extended in the first direction X and the second direction Y. The second corner portion 605 connects the third extension portion 604*a* with the fourth extension portion 604*b*, and may be in a direction different from the first direction X and the second direction Y.

First to fourth dummy lenses 380*a*, 380*b*, 380*c* and 380*d* of the plurality of dummy lenses 380 may be in the second corner portion 605. Slopes of virtual lines connecting outermost sidewalls of each of some dummy lenses among the first to fourth dummy lenses 380*a*, 380*b*, 380*c* and 380*d* may be different from each other.

That is, in the second corner portion 605, slopes of virtual lines connecting outermost sidewalls of the second color filter 170C on which the plurality of dummy lenses 380 are positioned may be different from each other. In other words, in the second corner portion 605, slopes of virtual lines connecting the outermost sidewalls of the first dummy structure 1024 are different from each other and may be increased or reduced as described below.

In detail, a slope between a third virtual line L3 connecting the outermost sidewall of the first dummy lens 380*a* with the outermost sidewall of the second dummy lens 380*b* and a virtual line L12 connecting the outermost sidewalls of the plurality of dummy lenses 380 in the first direction X may be a third acute angle a3.

A slope between a fourth virtual line L4 connecting the outermost sidewall of the second dummy lens 380*b* with the outermost sidewall of the third dummy lens 380*c* and the virtual line L12 connecting the outermost sidewalls of the plurality of dummy lenses 380 in the first direction X may be a fourth acute angle a4.

A slope between a fifth virtual line L5 connecting the outermost sidewall of the third dummy lens 380*c* with the outermost sidewall of the fourth dummy lens 380*d* and the virtual line L12 connecting the outermost sidewalls of the plurality of dummy lenses 380 in the first direction X may be a fifth acute angle a5.

In this case, the third acute angle a3 and the fourth acute angle a4 may be different from each other. The third acute angle a3 may be smaller than the fourth acute angle a4. In addition, the fourth acute angle a4 and the fifth acute angle a5 may be different from each other. The fifth acute angle a5 may be smaller than the fourth acute angle a4.

That is, the slope of the virtual line connecting the outermost sidewalls of each of at least some of the plurality of dummy lenses 380 may be increased and then reduced as the virtual line approaches the second extension portion 604*a*.

The second dummy structure 1025 may be in the first dummy region 1021 of the first substrate 110. The second dummy structure 1025 may include a second color filter 170C. The dummy lens 380 formed in the second dummy structure 1025 may have a shape flatter than the dummy lens 380 formed in the first dummy structure 1024.

The grid pattern 160 may not be between the sensor array region 101 and the first dummy region 1021. That is, referring to FIGS. 5 and 6, the grid pattern 160 may not be formed in the first corner portion 1023 of the light receiving region 1011.

In a process for forming a color filter structure, a stain defect may occur due to a flow of fluid or the like in a corner region between the light receiving region 1011 and the light shielding region 102. According to some embodiments, a shape of the corner region is formed in a substantially round shape, as shown in FIG. 4, where the reliability of the image sensor may be improved.

Figure 7:
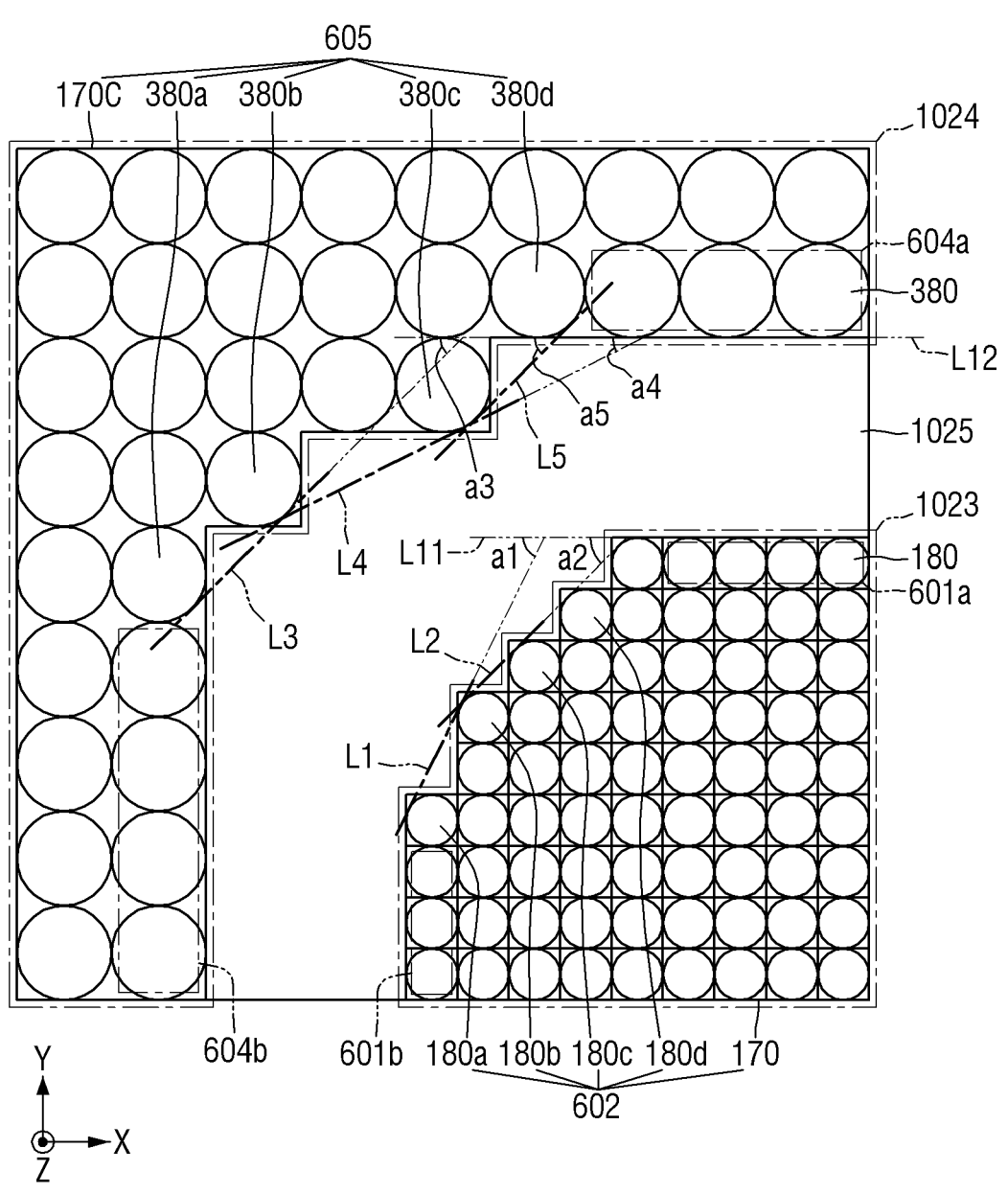
FIG. 7 is a first detailed view of the image sensor illustrated in FIG. 6 according to some embodiments of the present disclosure.
Figure 8:
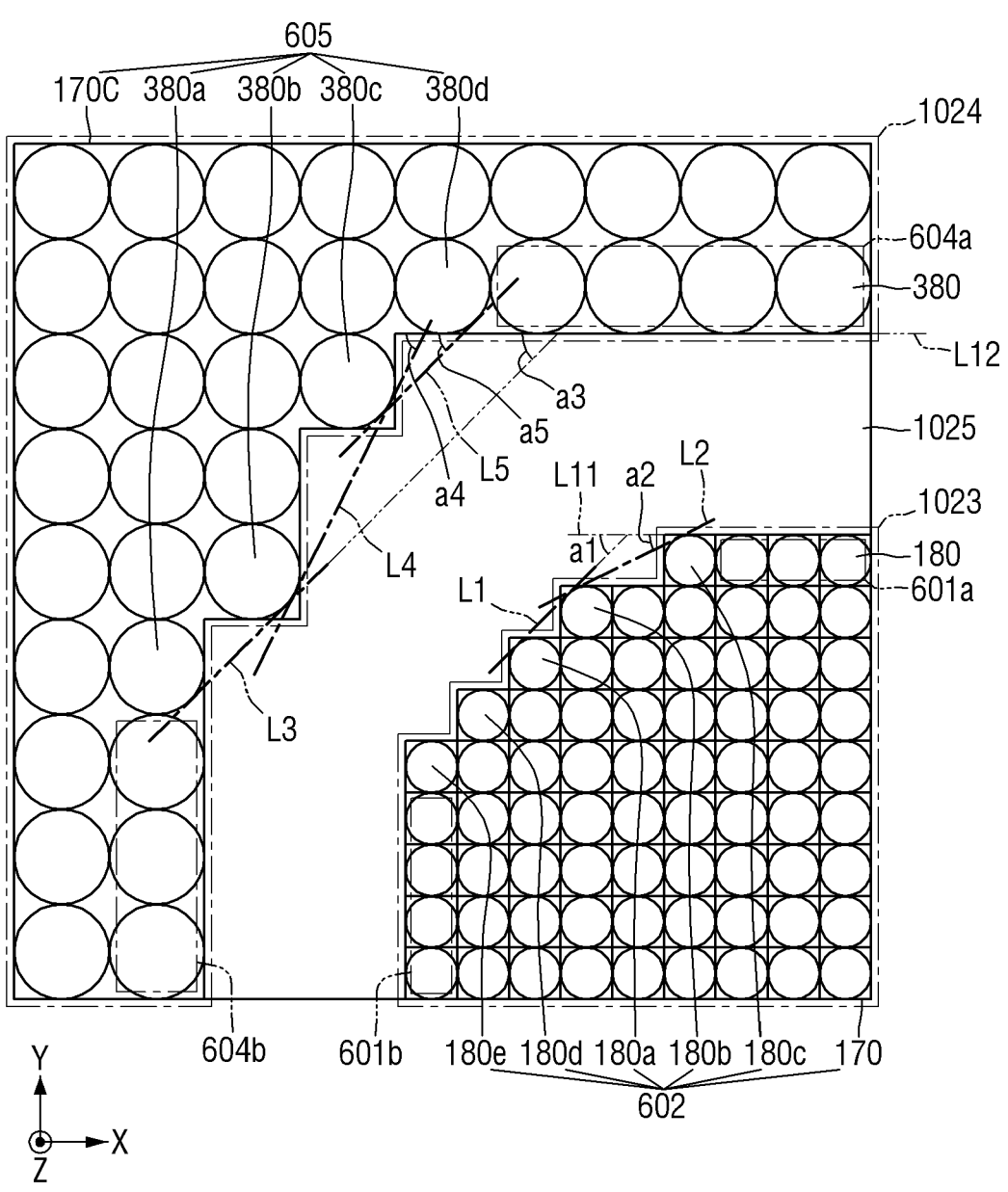
FIG. 8 is a second detailed view of the image sensor illustrated in FIG. 6 according to some embodiments of the present disclosure.
Figure 9:
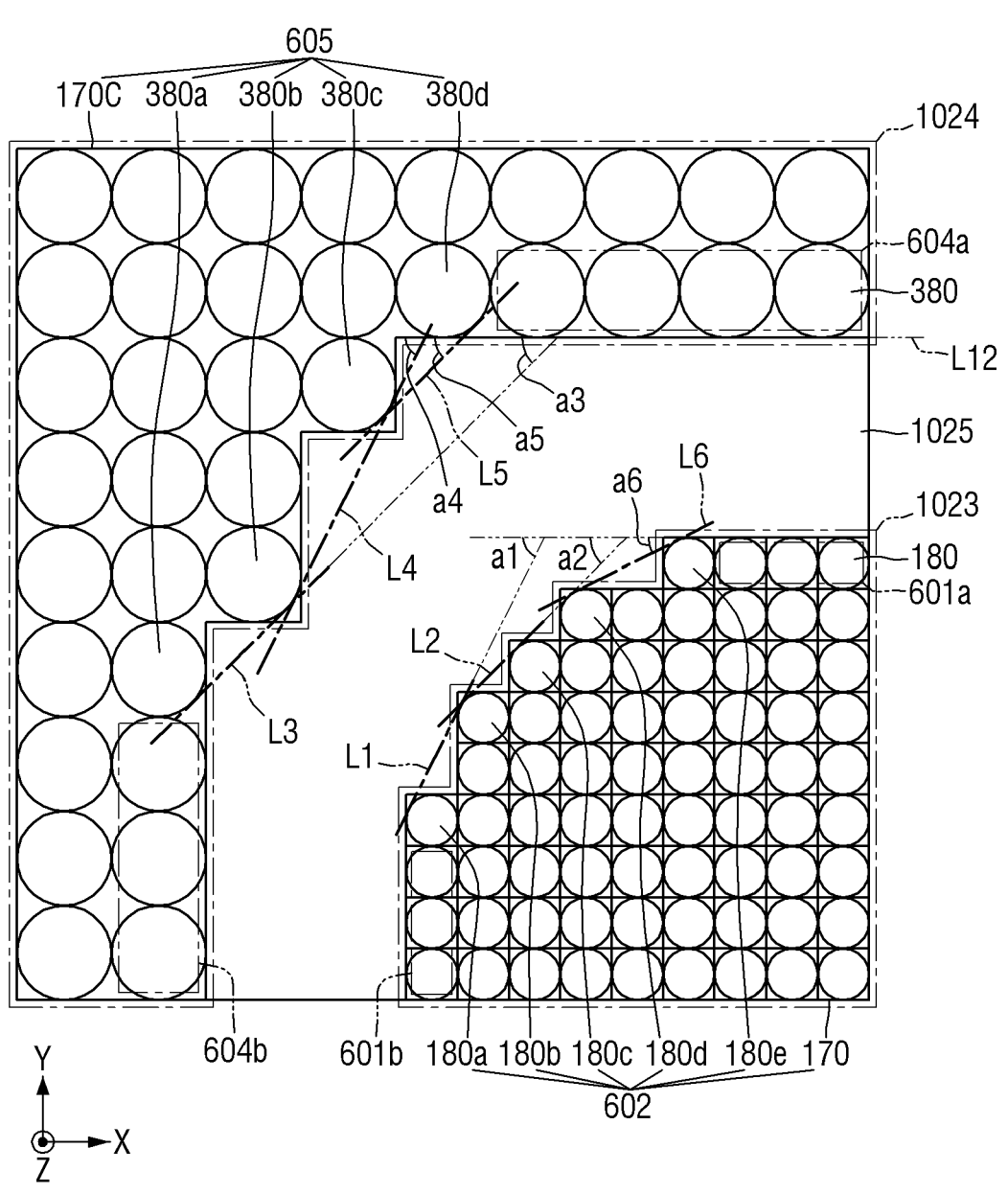
FIG. 9 is a third detailed view of the image sensor illustrated in FIG. 6 according to some embodiments of the present disclosure.

FIGS. 7 to 9 are views illustrating an image sensor according to some embodiments and correspond to FIG. 6. For convenience of description, the following description will be based on differences from those described with reference to FIGS. 1 to 6.

Referring to FIG. 7, first to fourth micro-lenses 180*a*, 180*b*, 180*c* and 180*d* of the plurality of micro-lenses 180 may be in the first corner portion 602.

The third acute angle a3 may be greater than the fourth acute angle a4. The fifth acute angle a5 may be greater than the fourth acute angle a4.

That is, a slope of a virtual line connecting the outermost sidewalls of each of the plurality of dummy lenses 380 may be reduced and then increased as the virtual line approaches the second extension portion 604*a*.

Referring to FIG. 8, first to fifth micro-lenses 180*a*, 180*b*, 180*c*, 180*d* and 180*e* of the plurality of micro-lenses 180 may be in the first corner portion 602.

The second acute angle a2 may be smaller than that of FIG. 6. That is, the slope of the virtual line connecting the outermost sidewalls of each of the plurality of micro-lenses 180 may be reduced as the virtual line approaches the first extension portion 601*a*.

Referring to FIG. 9, first to fifth micro-lenses 180*a*, 180*b*, 180*c*, 180*d* and 180*e* of the plurality of micro-lenses 180 may be in the first corner portion 602.

A slope between a sixth virtual line L6 connecting the outermost sidewall of the fourth micro-lens 180*d* with the outermost sidewall of the fifth micro-lens 180*e* and the virtual line L11 connecting the outermost sidewalls of the plurality of micro-lenses 180 in the first direction X may be a sixth acute angle a6.

In this case, the slope of the virtual line connecting the outermost sidewalls of each of the plurality of micro-lenses 180 may have a minimum slope in a region adjacent to the first extension portion 601a from among the plurality of slopes.

Figure 10:
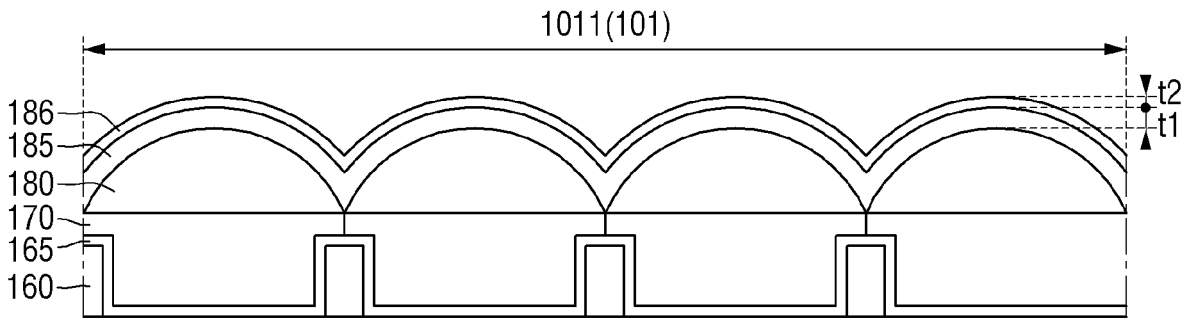
FIG. 10 is a detailed view of a region of the image sensor illustrated in FIG. 5 according to some embodiments of the present disclosure.

FIG. 10 is a view illustrating an image sensor according to some embodiments and corresponds to an enlarged view of a region 107 of FIG. 5. For convenience of description, the following description will be based on differences from those described with reference to FIGS. 1 to 9.

The image sensor according to some embodiments may further include a third passivation layer 186.

Referring to FIG. 10, the third passivation layer 186 may be further formed on the second passivation layer 185. The third passivation layer 186 may extend along a surface of the second passivation layer 185.

A thickness t2 of the third passivation layer 186 may be thinner than a thickness t1 of the second passivation layer 185. For example, the thickness t2 of the third passivation layer 186 may be 100 Å to 300 Å, including endpoints, and the thickness t1 of the second passivation layer 185 may be 1000 Å to 1500 Å, including endpoints, but the thicknesses are not limited thereto.

The third passivation layer 186 may include, for example, an inorganic oxide layer. For example, the third passivation layer 186 may include, but is not limited to, at least one of silicon oxide, titanium oxide, zirconium oxide, and hafnium oxide.

For example, the second passivation layer 185 may be formed using a Plasma Enhanced Chemical Vapor Deposition (PECVD) process, and the third passivation layer 186 may be formed using an Atomic Layer Deposition (ALD) process, but the present disclosure is not limited thereto.

Figure 11:
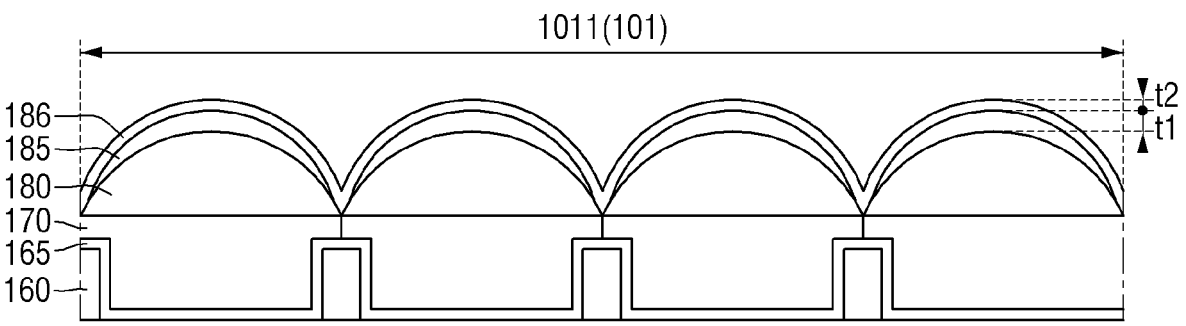
FIG. 11 is a detailed view of the image sensor illustrated in FIG. 10 according to some embodiments of the present disclosure.

FIG. 11 is a view illustrating an image sensor according to some embodiments and corresponds to FIG. 10. For convenience of description, the following description will be based on differences from those described with reference to FIG. 10.

Referring to FIG. 11, the second passivation layer 185 may not be in a region between the micro-lenses 180 to partially expose the micro-lenses 180. The third passivation layer 186 may be formed on the second passivation layer 185 to cover the exposed micro-lenses 180. In this case, the third passivation layer 186 may be in contact with the exposed micro-lenses 180.

FIGS. 12 to 15 are exemplary views illustrating an image sensor according to some embodiments. For convenience of description, the following description will be based on differences from those described with reference to FIGS. 1 to 11.

Figure 12:
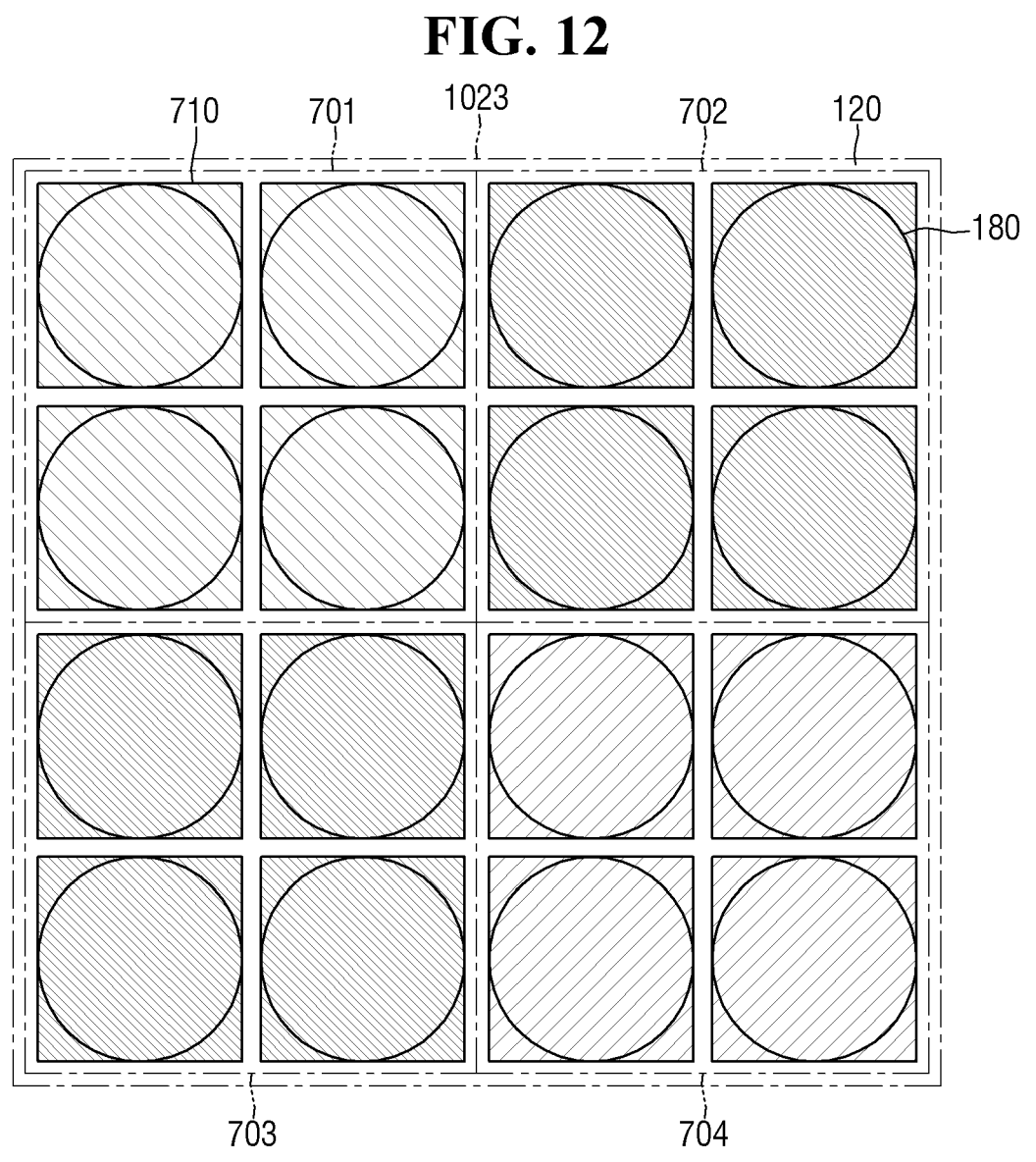

Referring to FIG. 12, the color filter structure 1023 of the image sensor according to some embodiments may include first to fourth pixel groups 701, 702, 703 and 704. Each of the first to fourth pixel groups 701, 702, 703, 704 may include a plurality of pixels 710. For example, each of the first to fourth pixel groups 701, 702, 703, 704 may include pixels 710 arranged in two rows and two columns.

The color filter (e.g., 170 in FIG. 5) on each pixel 710 may be arranged in a Bayer pattern. For example, the color filter on each pixel 710 in the first pixel group 701 may include a first color filter, the color filter on each pixel 710 in the second pixel group 702 and the third pixel group 703 may include a second color filter, and the color filter on each pixel 710 in the fourth pixel group 704 may include a third color filter. The first color filter may be a red color filter, the second color filter may be a green color filter, and the third color filter may be a blue color filter.

Figure 13:
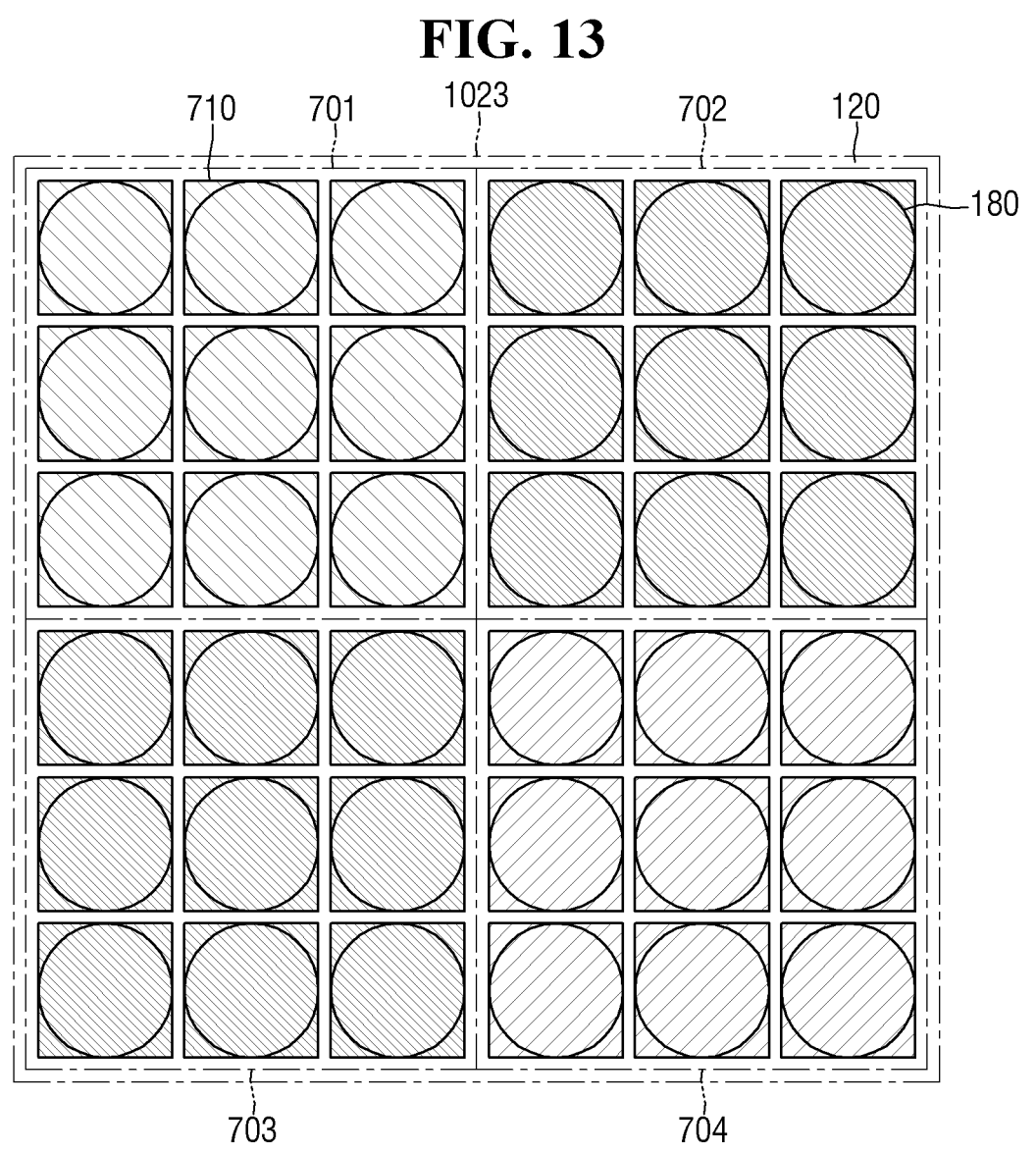

Referring to FIG. 13, each of the first to fourth pixel groups 701, 702, 703, 704 may include pixels 710 arranged in three rows and three columns.

Figure 14:
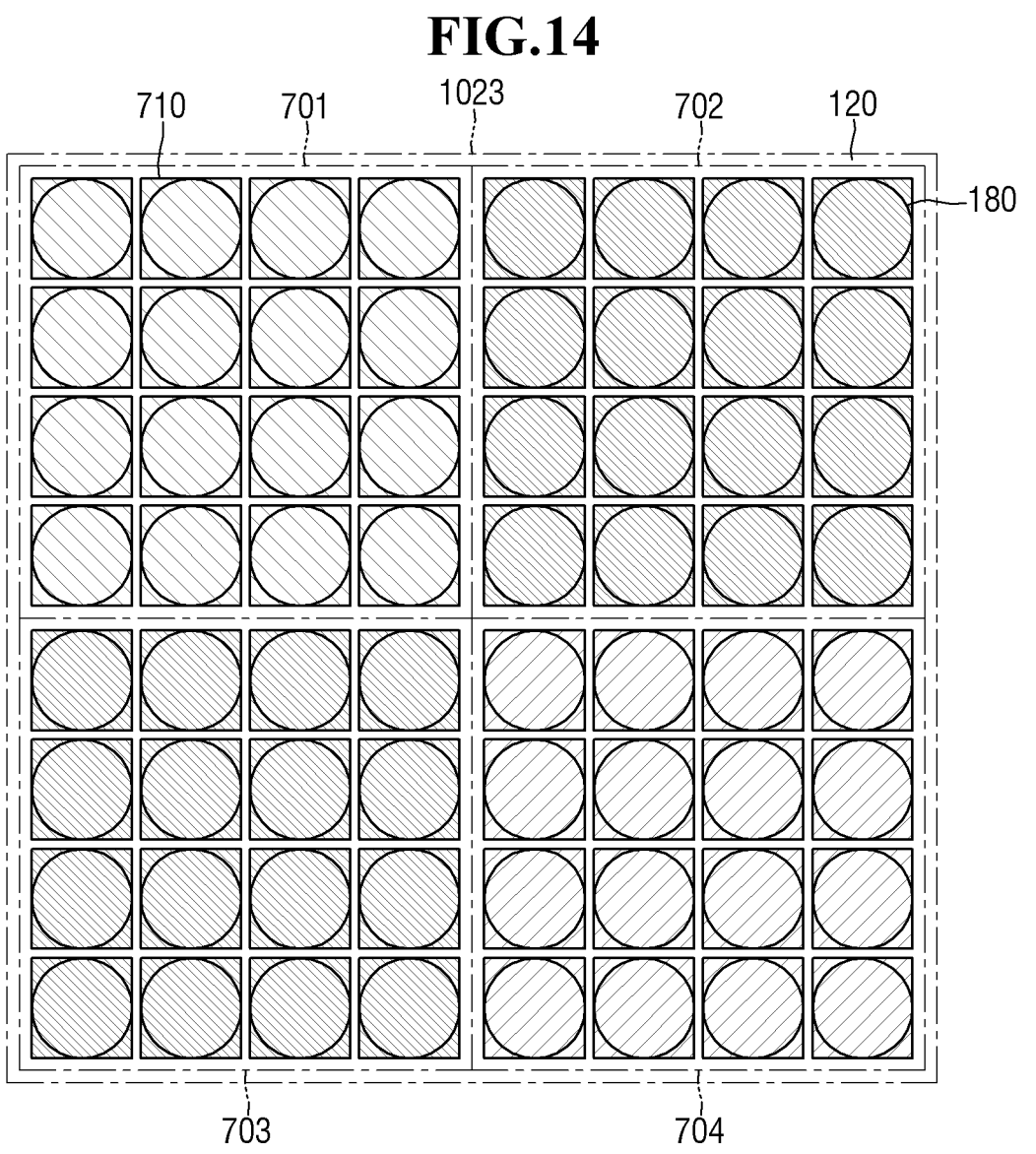
FIG. 14 is an exemplary view of an image sensor according to some embodiments of the present disclosure.

Referring to FIG. 14, each of the first to fourth pixel groups 701, 702, 703, 704 may include pixels 710 arranged in four rows and four columns.

Figure 15:
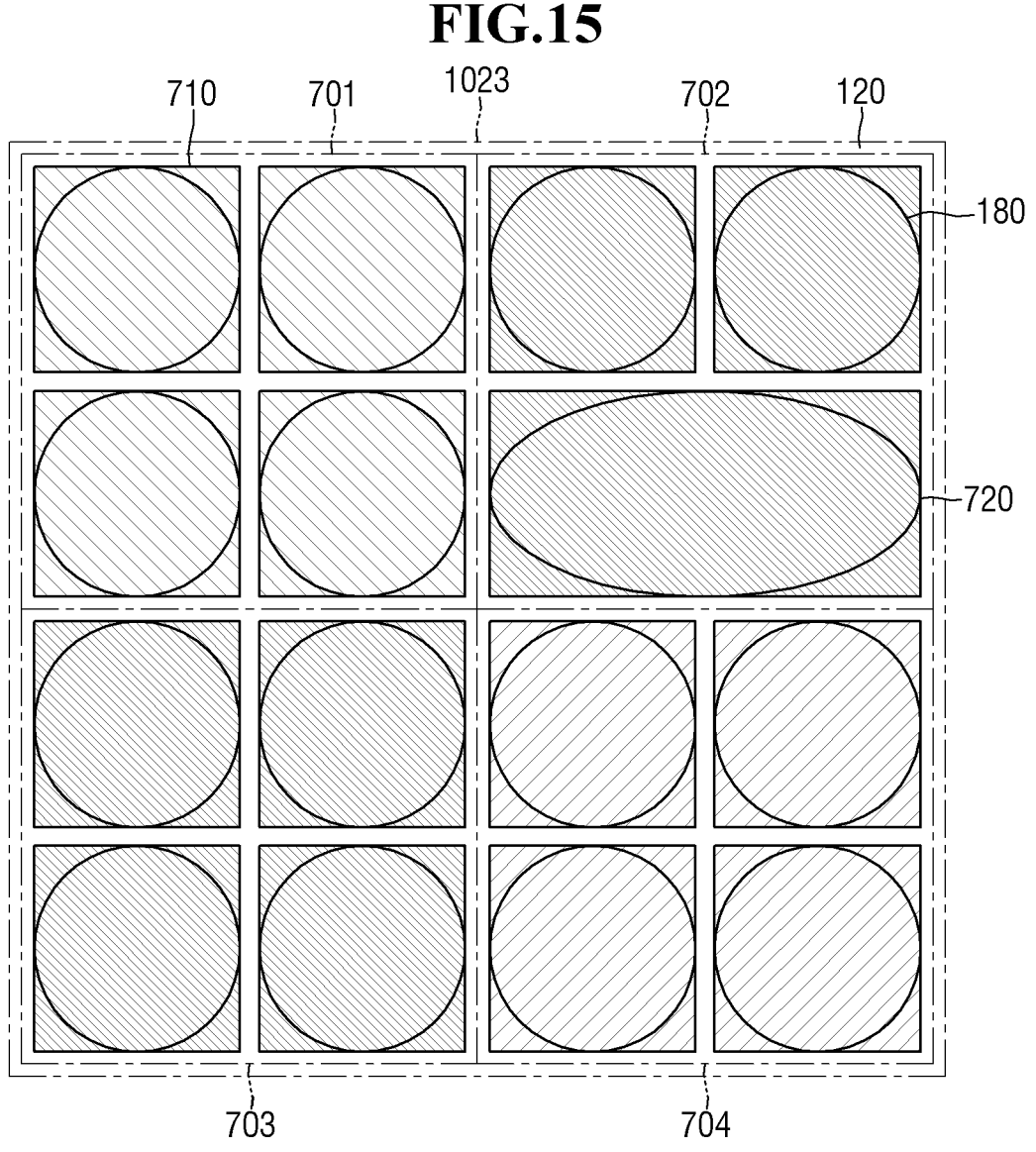
FIG. 15 is an exemplary view of an image sensor according to some embodiments of the present disclosure.

Referring to FIG. 15, the image sensor may include a focus pixel 720. It should be understood that any number of focus pixels 720 may be provided having various arrangements and are not limited to the examples described herein.

The focus pixel 720 may include two subpixels. The focus pixel 720 may perform an auto focus (AF) function. The auto focus function may be performed using Phase Detection AF (PDAF) by the subpixel. The subpixel may have a structure similar to the pixel 710. The micro-lens 180 may correspond to the pixel 710 and the focus pixel 720.

Figure 16:
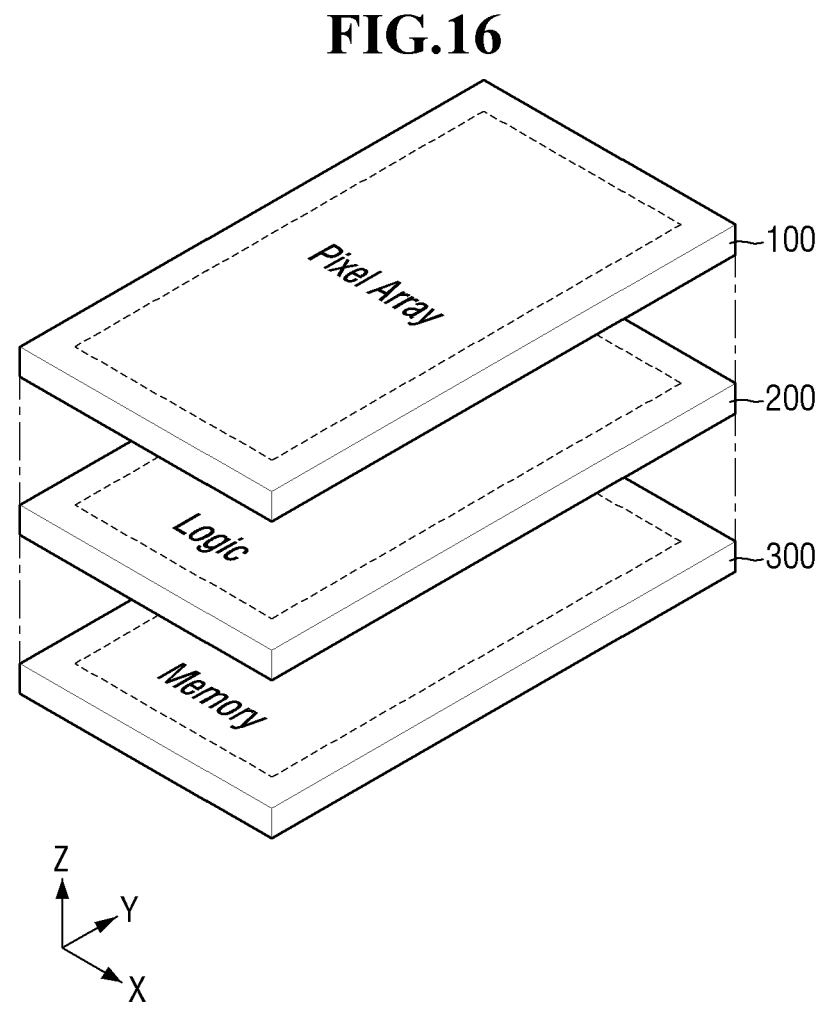
FIG. 16 is a view illustrating a conceptual layout of an image sensor according to some embodiments of the present disclosure.

FIG. 16 illustrates another diagram of an image sensor according to some embodiments. For convenience of description, the following description will be based on differences from those described with reference to FIG. 3.

Referring to FIG. 16, the image sensor according to some embodiments may further include a third substrate structure 300. The first substrate structure 100, the second substrate structure 200 and the third substrate structure 300 may be sequentially stacked along the third direction Z. The third substrate structure 300 may be below the second substrate structure 200. That is, the second substrate structure 200 may be between the first substrate structure 100 and the third substrate structure 300.

The third substrate structure 300 may include a memory device. The third substrate structure 300 may include, for example, a volatile memory device such as a dynamic random-access memory (DRAM), a static random-access memory (SRAM), or the like. The third substrate structure 300 may receive a signal from the first substrate structure 100 and the second substrate structure 200 and process the signal through the memory device. That is, the image sensor, which includes the third substrate structure 300, may correspond to a three-stack image sensor.

Although the embodiments of the present disclosure have been described with reference to the accompanying drawings, it will be apparent to those skilled in the art that the present disclosure can be manufactured in various forms without being limited to the above-described embodiments and can be embodied in other specific forms without departing from technical spirits and characteristics of the present disclosure. Thus, the above embodiments are to be considered in all respects as illustrative and not restrictive.

What is claimed is:

1. An image sensor comprising:
   a substrate including a first region and a second region in a periphery of the first region;
   wherein the first region includes a plurality of unit pixels and a color filter structure, each unit pixel of the plurality of unit pixel includes a photoelectric conversion layer, the color filter structure includes a plurality of first color filters and a plurality of micro-lenses on the plurality of first color filters;
   wherein the second region includes a dummy structure including a second color filter and a plurality of dummy lenses on the second color filter, wherein a size of each of the plurality of dummy lenses is larger than a size of each of the plurality of micro-lenses;
   wherein, in a region adjacent to the dummy structure, the color filter structure includes a first extension portion extending in a first direction and a second extension portion extending in a second direction, wherein the first direction and the second direction intersect, and wherein the first extension portion and the second extension portion are connected by a first corner portion;

wherein, in a region adjacent to the color filter structure, the dummy structure includes a third extension portion extending in the first direction and a fourth extension portion extending in the second direction, wherein the third extension portion and the fourth extension portion are connected by a second corner portion;

wherein a first micro-lens, a second micro-lens, and a third micro-lens among the plurality of micro-lenses are in the first corner portion, and wherein a slope of each virtual line connecting outermost sidewalls of each of the first-micro lens, the second micro-lens, and the third micro-lens is different; and wherein a first dummy lens, a second dummy lens, and a third dummy lens from among the plurality of dummy lenses are in the second corner portion, wherein a slope of each virtual line connecting outermost sidewalls of each of the first dummy lens, the second dummy lens, and the third dummy lens is different.

2. The image sensor of claim 1, wherein the slope of each virtual line connecting the outermost sidewalls of each of the first micro-lens, the second micro-lens, and the third micro-lens and a slope of each virtual line connecting the outermost sidewalls of each additional micro-lens from among the plurality of micro-lenses is increased or reduced as the virtual line approaches the first extension portion.

3. The image sensor of claim 1, wherein a slope formed by the virtual line connecting the outermost sidewalls of each of the plurality of micro-lenses in the first corner portion and the virtual line connecting the outermost sidewalls of each of the plurality of micro-lenses in the first extension portion is an acute angle.

4. The image sensor of claim 1, wherein the slope of each virtual line connecting the outermost sidewalls of the first dummy lens, the second dummy lens, and the third dummy lens and a slope of each virtual line connecting the outermost sidewalls of each additional dummy lens from among the plurality of dummy lenses is increased or reduced as the virtual line approaches the third extension portion.

5. The image sensor of claim 1, wherein a slope formed by the virtual line connecting the outermost sidewalls of each of the plurality of dummy lenses in the second corner portion and the virtual line connecting the outermost sidewalls of each of the plurality of dummy lenses in the third extension portion is an acute angle.

6. The image sensor of claim 1, wherein the substrate further includes a third region between the first and second regions, wherein the third region includes the second color filter.

7. The image sensor of claim 6, wherein the color filter structure further includes a grid pattern between the plurality of first color filters, and wherein the grid pattern is not between the third region and the first region.

8. The image sensor of claim 1, further comprising a first passivation layer formed on the plurality of micro-lenses along a surface of each of the plurality of micro-lenses.

9. The image sensor of claim 8, further comprising a second passivation layer formed on the first passivation layer, wherein a thickness of the second passivation layer is less than a thickness of the first passivation layer.

10. The image sensor of claim 9, wherein the first passivation layer is not in a region between the plurality of micro-lenses to partially expose the plurality of micro-lenses, and wherein the second passivation layer is formed on the first passivation layer to cover exposed micro-lenses from among the plurality of micro-lenses.

11. The image sensor of claim 9, wherein the second passivation layer contacts the partially exposed micro-lenses.

12. An image sensor comprising:

a substrate including a first region, a second region in a periphery of the first region, and a third region between the first region and the second region;

wherein the first region includes a plurality of unit pixels and a color filter structure, wherein the plurality of unit pixels include including a photoelectric conversion layer, and wherein the color filter structure includes a plurality of first color filters, a plurality of micro-lenses on the plurality of first color filters, and a grid pattern between the plurality of first color filters and the plurality of micro-lenses;

wherein the second region includes a first dummy structure that includes a second color filter and a plurality of dummy lenses on the second color filter, wherein a size of each of the plurality of dummy lenses is larger than a size of each of the plurality of micro-lenses;

wherein the third region includes a second dummy structure that includes the second color filter, wherein, in a region adjacent to the first dummy structure, the color filter structure includes a first extension portion extending in a first direction and a second extension portion extending in a second direction, wherein the first direction and second direction intersect, and wherein the first extension portion and the second extension portion are connected by a first corner portion;

wherein, in a region adjacent to the color filter structure, the first dummy structure includes a third extension portion extending in the first direction and a fourth extension portion extending in the second direction, wherein the third extension portion and the fourth extension portion are connected by a second corner portion; and wherein the grid pattern is not disposed in the first corner portion.

13. The image sensor of claim 12, wherein the plurality of micro-lenses includes a first micro-lens, a second micro-lens, and a third micro-lens that are disposed in the first corner portion, and a slope of each virtual line connecting outermost sidewalls of each of the first micro-lens, the second micro-lens, and the third micro-lens is different.

14. The image sensor of claim 12, wherein the plurality of dummy lenses includes a first dummy lens, a second dummy lens, and a third dummy lens that are disposed in the second corner portion, and a slope of each virtual line connecting outermost sidewalls of each of the first dummy lens, the second dummy lens, and the third dummy lens is different.

15. The image sensor of claim 12, wherein a slope of each virtual line connecting outermost sidewalls of each of the plurality of first color filters is different.

16. The image sensor of claim 12, wherein a slope of each virtual line connecting outermost sidewalls of the second color filter is different.

17. The image sensor of claim 12, further comprising a first passivation layer formed on the plurality of micro-lenses along a surface of each of the plurality of micro-lenses.

18. The image sensor of claim 17, wherein the first passivation layer is spaced apart from another one on the plurality of micro-lenses, wherein the image sensor further comprises a second passivation layer formed on the first passivation layer, and wherein the second passivation layer contacts the plurality of micro-lenses.

19. An image sensor comprising:

a substrate including first and second surfaces facing each other, the substrate including a first region, a second region in a periphery of the first region, and a third region between the first region and the second region;

a plurality of unit pixels in the first region of the substrate, wherein the plurality of unit pixels include a photoelectric conversion layer;

a wiring structure on the first surface of the substrate, wherein the wiring structure includes an inter-wiring insulating layer and a first wiring in the inter-wiring insulating layer;

a color filter structure on the second surface of the substrate and in the first region of the substrate, wherein the color filter structure includes a plurality of first color filters and a plurality of micro-lenses on the plurality of first color filters;

a first dummy structure on the second surface of the substrate and in the second region of the substrate, wherein the first dummy structure includes a second color filter and a plurality of dummy lenses on the second color filter;

a second dummy structure in the third region of the substrate, wherein the second dummy structure includes the second color filter;

a first passivation layer formed on the plurality of micro-lenses along a surface of each of the plurality of micro-lenses; and a second passivation layer formed on the first passivation layer, wherein, in a region adjacent to the first dummy structure, the color filter structure includes a first extension portion extending in a first direction and a second extension portion extending in a second direction, wherein the first direction and second direction intersect, and wherein the first extension portion and the second extension portion are connected by a first corner portion, wherein, in a region adjacent to the color filter structure, the first dummy structure includes a third extension portion extending in the first direction and a fourth extension portion extending in the second direction, wherein the third extension portion and the fourth extension portion are connected by a second corner portion, a slope of a virtual line connecting outermost sidewalls of the color filter structure is increased or reduced in the first corner portion, and a slope of a virtual line connecting outermost sidewalls of the first dummy structure is increased or reduced in the second corner portion.

20. The image sensor of claim 19, wherein the color filter structure further includes a grid pattern between the plurality of first color filters, and wherein the grid pattern is not in the first corner portion.

* * * * *